US005940003A

United States Patent [19]

Schulz

[11] Patent Number: 5,940,003

[45] Date of Patent: Aug. 17, 1999

[54] MAGNETIC FIELD SENSOR FOR A KEYLESS ACCESS SYSTEM FOR MOTOR VEHICLES

[75] Inventor: Martin Schulz, Bedburg, Germany

[73] Assignee: Ford Global Technologies, Inc., Dearborn, Mich.

[21] Appl. No.: 09/048,483

[22] Filed: Mar. 26, 1998

[30] Foreign Application Priority Data

Mar. 27, 1997 [DE] Germany .......................... 197 12 911

[51] Int. Cl.$^6$ .......................... H01Q 19/00; G01R 33/00

[52] U.S. Cl. .............. 340/825.31; 324/200; 324/207.13; 324/207.15; 324/246; 343/700 R; 343/713

[58] Field of Search .................... 340/825.31; 324/207.2, 324/207.22, 5, 200, 228, 207.13, 207.15; 343/700 R, 713, 728

[56] References Cited

U.S. PATENT DOCUMENTS

| | | | |
|---|---|---|---|
| 4,622,754 | 11/1986 | Chujo et al. | 33/356 |
| 5,099,247 | 3/1992 | Basile et al. | 342/380 |
| 5,519,318 | 5/1996 | Koerner et al. | 324/252 |
| 5,532,709 | 7/1996 | Talty | 343/819 |

FOREIGN PATENT DOCUMENTS

| | | |
|---|---|---|
| 38 20 248-A1 | 6/1988 | Germany . |

*Primary Examiner*—William A. Cuchlinski, Jr.
*Assistant Examiner*—Yonel Beaulieu
*Attorney, Agent, or Firm*—Mark Mollon

[57] ABSTRACT

A magnetic field sensor for a keyless access system, particularly for motor vehicles, wherein the direction of incidence of electromagnetic radiation emitted by a transmitter in the short-range field can be detected. The magnetic field sensor has at least one first and at least one second conductor loop, which are disposed substantially concentrically with one another and are substantially symmetrical with respect to the center.

5 Claims, 1 Drawing Sheet

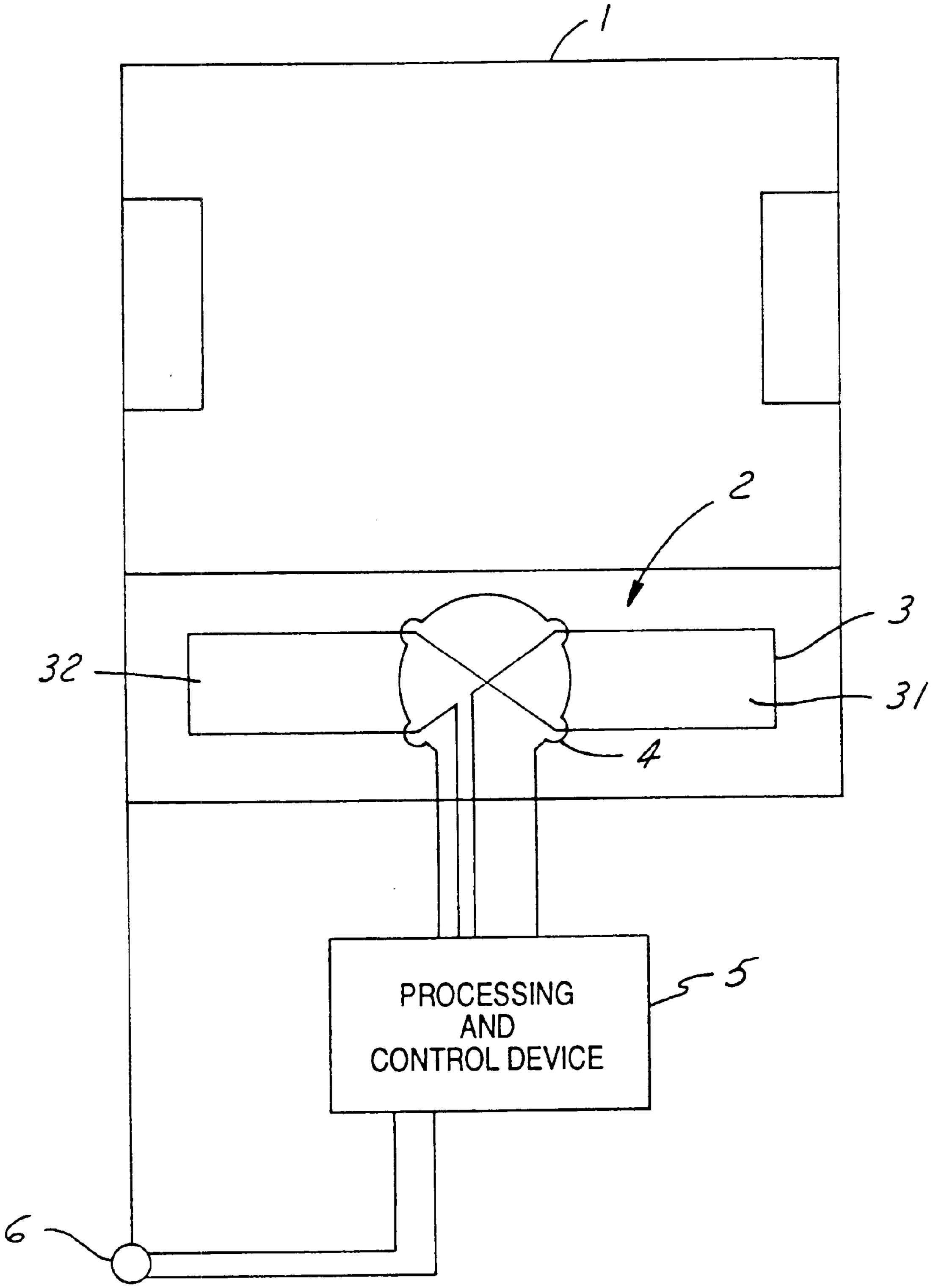
1
2
3
32
31
4
PROCESSING
AND
CONTROL DEVICE
5
6

MAGNETIC FIELD SENSOR FOR A KEYLESS ACCESS SYSTEM FOR MOTOR VEHICLES

FIELD OF THE INVENTION

The invention relates to a magnetic field sensor (antenna) for a keyless access system, more particularly for motor vehicles, with which the direction of incidence of an electromagnetic radiation emitted by a transmitter in the short-range field can be detected.

BACKGROUND OF THE INVENTION

Keyless access systems are known, for example from German specification DE 38 20 248 A1. This system comprises a portable radio transmitter, a manually actuated triggering switch mounted on the vehicle, a control device which is also connected to actuating devices and a further antenna, also mounted in or on the vehicle, which comprises a first frame antenna having a magnetic field formed substantially parallel to the center line of the vehicle and a second frame antenna having a magnetic field substantially transverse to the center line of the vehicle. The second frame antenna is said to be located between an outer and an inner surface of the vehicle near the triggering switch.

Recognition of the direction of incidence of the electromagnetic radiation emitted by the portable transmitter is neither provided for nor, with the antenna structure described, does it appear to be possible with the desired accuracy for the application contemplated here.

OBJECT OF THE INVENTION

Increased demands for security make it appear desirable to install on the vehicle a keyless access system which is capable of opening only the door nearest to the portable transmitter. For this purpose it is necessary to install in the vehicle an antenna which allows the determination in the short range field of the position of the portable transmitter relative to the center of the vehicle or the center line of the vehicle, respectively.

SUMMARY OF THE INVENTION

The magnetic field sensor in accordance with the invention comprises at least one first and at least one second conductor loop. The first conductor loop has an elongated shape (e.g. a rectangular or elliptical shape with an aspect ratio substantially greater than unity). The second conductor loop is disposed concentrically with the first and is likewise symmetrically shaped.

In particular the distance of the second conductor loop from the center is substantially constant (e.g. the loop is circular or square in shape). The second conductor loop provides a reference so that the direction can be determined from the ratio of the voltages induced in the conductor loops. To perform the evaluation the magnetic sensor is connected to a processing unit. The conductor loops are substantially planar, preferably corresponding to a printed circuit.

Preferably the dimensions of the conductor loops are such that the voltage induced in the second conductor loop is of approximately the same order of magnitude as the voltage resulting in the crossed loop.

In another preferred embodiment the first conductor loop has a portion, in particular in the middle, in which the conductor loop crosses over. This conductor loop with an approximately figure-of-eight shaped contour gives rise to a phase difference so that the output voltage becomes zero if the voltage induced in the portions of the conductor loop adjacent to the crossing point is the same. By means of the cross-over an addition with different polarity is performed.

Preferably the first conductor loop has two substantially symmetrical portions of relatively large area, which are also symmetrically disposed. The precision of the determination of direction is thereby improved. What is important is not so much the shape of the individual portions (e.g. round, having corners, elliptical) but their symmetry with respect to the crossing point.

According to a further preferred embodiment a third conductor loop is provided which corresponds in shape and position to the first conductor loop but has its plane at right angles thereto. This, in combination with a processor, makes it possible to determine all four spatial directions lying in the plane of the magnetic sensor. Locking devices mounted at the front and back of the vehicle can then also be included in the keyless locking system.

It is preferred to employ the magnetic field sensor in accordance with the invention in a circuit in a motor vehicle which includes at least one processing and control device which is also connected to actuators for actuation of the door locks and/or to other devices (e.g. ignition circuit).

BRIEF DESCRIPTION OF THE DRAWING

The invention is described in more detail below, by way of example, with reference to the magnetic field sensor in accordance with the invention shown in the accompanying schematic drawing.

DETAILED DESCRIPTION OF PREFERRED EMBODIMENTS

In the motor vehicle 1, particularly in the dashboard area, the magnetic field sensor 2 comprising first conductor loop 3 and second conductor loop 4 is mounted normal to the center line of the vehicle. In a middle region of the first conductor loop 3 its conductors are crossed. As an alternative to the figure-of-eight shape, paddle-shaped embodiments with or without crossed conductors could be used, wherein between the larger-area portions 31, 32 a narrower, elongated, smaller-area portion is located centrally. In the embodiment without crossed conductors the difference between the induced voltages is generated electronically. The magnetic field sensor is preferably tuned to a wavelength which is significantly longer than the operating distance of the portable transmitter, so that within this distance the antenna lies in the short-range field of the portable transmitter, so that the intensity falls off as the third power (of the distance) and the difference between the induced currents increases. The magnetic field sensor 2 is provided with a processing and control device 5 to which the actuating devices 6 for unlocking and locking of the locks are connected.

What is claimed is:

1. A magnetic field sensor for a remote-controlled vehicle entry system comprising a first conductor loop and a second conductor loop in the form of coils located substantially in the same plane, said first conductor loop having a longitudinal axis directed between opposite sides of a vehicle, and said second conductor loop being arranged concentrically with said first conductor loop and being shaped symmetrically with respect to a common center point of said first and second conductor loops, wherein said first conductor loop crosses over itself substantially at said common center point so that transmitter signals received by said first conductor loop from a direction substantially along said longitudinal axis are phase-shifted with respect to signals received by said second conductor loop, and wherein the direction of said phase shift identifies from which of said opposite sides of said vehicle said transmitter signals originated.

2. A magnetic field sensor as claimed in claim 1 wherein said second conductor loop is at a substantially constant distance from said common center point.

3. A magnetic field sensor as claimed in claim 1 further comprising an evaluation unit coupled to said first and second conductor loops which determines a direction of said phase shift between voltages induced across said first and second conductor loops.

4. A magnetic field sensor as claimed in claim 1 wherein an area surrounded by said second conductor loop is selected such that an induced voltage of said second conductor loop is of about the same order of magnitude as an induced voltage in said first conductor loop.

5. A motor vehicle comprising:

a door lock actuator;

a remote-controlled processing and control device connected to said actuator; and a magnetic field sensor for receiving and localizing a remote control signal, said magnetic field sensor comprising a first conductor loop and a second conductor loop in the form of coils located substantially in the same plane, said first conductor loop having a longitudinal axis directed between opposite sides of a vehicle, and said second conductor loop being arranged concentrically with said first conductor loop and being shaped symmetrically with respect to a common center point of said first and second conductor loops, wherein said first conductor loop crosses over itself substantially at said common center point so that remote control signals received by said first conductor loop from a direction substantially along said longitudinal axis are phase-shifted with respect to signals received by said second conductor loop, and wherein the direction of said phase shift identifies from which of said opposite sides of said vehicle said remote control signals originated.

* * * * *